United States Patent [19]

Benjamin et al.

[11] Patent Number: 4,670,764
[45] Date of Patent: Jun. 2, 1987

[54] MULTI-CHANNEL POWER JFET WITH BURIED FIELD SHAPING REGIONS

[75] Inventors: James A. Benjamin, Waukesha; Herman P. Schutten, Milwaukee, both of Wis.; Robert W. Lade, Fort Myers, Fla.

[73] Assignee: Eaton Corporation, Cleveland, Ohio

[21] Appl. No.: 848,848

[22] Filed: Apr. 4, 1986

Related U.S. Application Data

[63] Continuation of Ser. No. 618,433, Jun. 8, 1984, abandoned.

[51] Int. Cl.[4] .................................. H01L 29/80
[52] U.S. Cl. .................................. 357/22; 357/20; 357/41; 357/52; 357/55; 357/86
[58] Field of Search .................. 357/22, 20, 86, 41, 357/55, 52

[56] References Cited

U.S. PATENT DOCUMENTS

| | | | |
|---|---|---|---|
| 2,820,154 | 1/1958 | Kurshan | 357/22 |
| 2,989,713 | 6/1961 | Warner | 357/22 |
| 3,035,186 | 5/1962 | Poucette | 357/52 |
| 3,274,461 | 9/1966 | Teszner | 357/22 |
| 3,372,316 | 3/1968 | Teszner | 357/22 |
| 3,497,777 | 2/1970 | Teszner | 357/22 |
| 3,648,131 | 3/1972 | Stuby | 357/68 |
| 3,878,552 | 4/1975 | Rodgers | 357/55 |
| 3,975,752 | 8/1976 | Nicolay | 357/55 |
| 4,270,059 | 5/1981 | Nishizawa et al. | 357/22 |
| 4,393,391 | 7/1983 | Blanchard | 357/23.4 |

FOREIGN PATENT DOCUMENTS

| | | |
|---|---|---|
| 689743 | 6/1964 | Canada . |
| 0053854 | 6/1982 | European Pat. Off. . |
| 0083815 | 7/1983 | European Pat. Off. . |
| 3345189 | 6/1984 | Fed. Rep. of Germany . |
| 1377330 | 9/1964 | France . |
| 2152656 | 4/1973 | France . |
| 2454703 | 11/1980 | France . |

OTHER PUBLICATIONS

"Simultaneous Modulation of Electron and Hole Conductivity in a New Periodic GaAs Doping Multilayer Structure", K. Ploog et al, Applied Physics Letters, vol. 38, No. 11, Jun. 1981, pp. 870–873, New York.

Primary Examiner—Joseph E. Clawson, Jr.
Attorney, Agent, or Firm—Andrus, Sceales, Starke & Sawall

[57] ABSTRACT

A power JFET (2) has a stack (4) of alternating conductivity type layers (5–9) forming a plurality of channels (6, 8). The JFET has an ON state conducting bidirectional current horizontally through the channels. The channels are stacked vertically, and the JFET has an OFF state blocking current flow through the channels due to vertical depletion pinch-off. Various main and gate terminal and drift region structures are disclosed.

3 Claims, 12 Drawing Figures

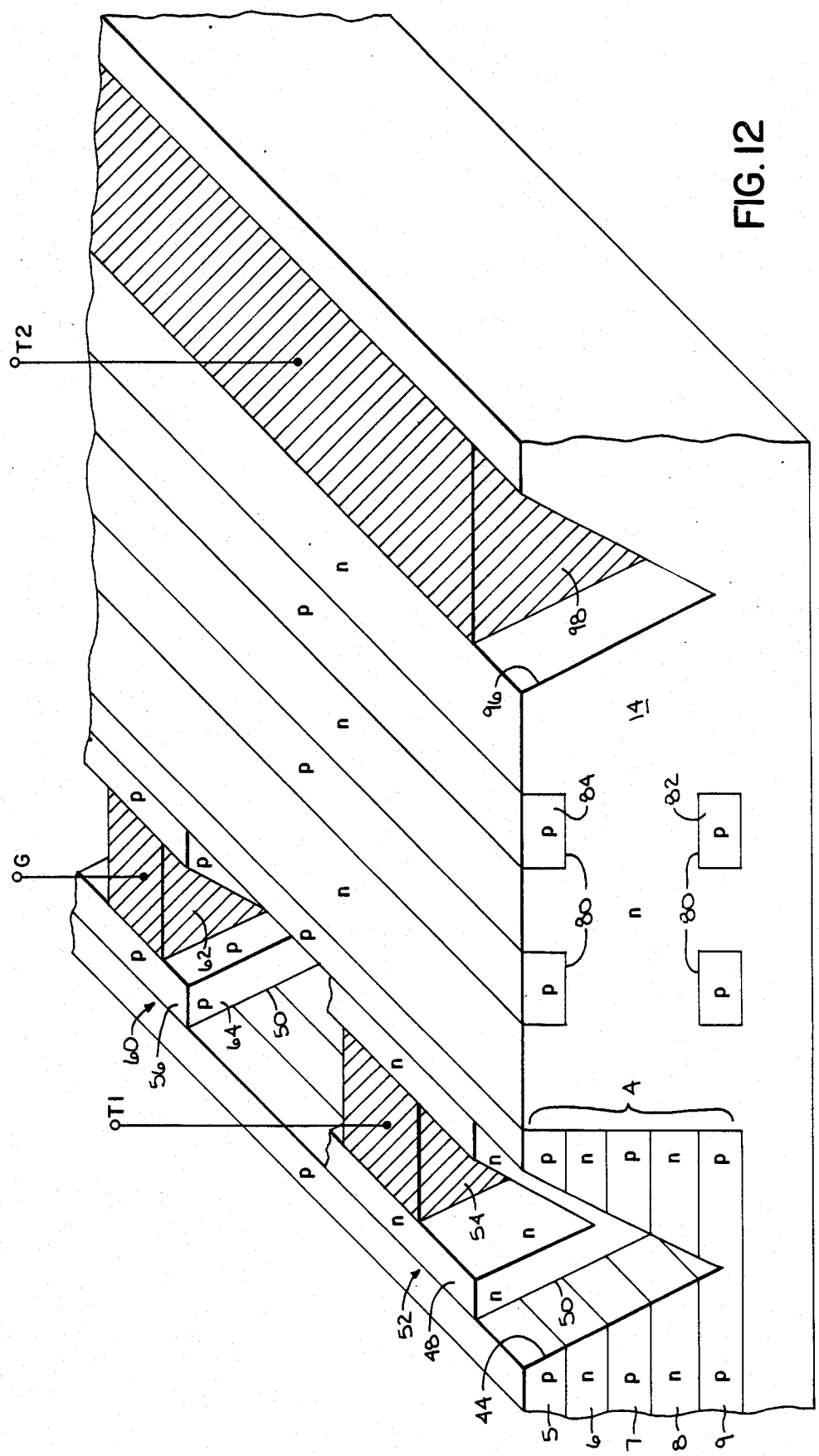

MULTI-CHANNEL POWER JFET WITH BURIED FIELD SHAPING REGIONS

This is a continuation of application Ser. No. 06/618,433, filed June 8, 1984 now abandoned.

BACKGROUND AND SUMMARY

The invention relates to a junction field effect transistor (JFET) affording high blocking voltage capability, including AC application.

A power JFET is provided with a stack of alternating conductivity type layers forming a plurality of channels. Bidirectional current is conducted through the channels in an ON state. In the OFF state, current flow is blocked by depletion region pinch-off in the channels.

In preferred form, ON state conduction current flows longitudinally horizontally through the channels and through a drift region of like conductivity type as the channels, with consequent desirable bulk effect characteristics. The channels are stacked vertically at the end of the drift region, with current flowing horizontally through the channels in the ON state, and being pinched-off in the OFF state by vertical depletion region spreading. A drift region may be provided at one or both ends of the stacked channels. Linear geometry enables desirable control of breakdown voltage, and in turn a higher blocking voltage capability. Multiple channels reduce the channel component of the ON state resistance.

Further in the preferred form, field shaping regions are provided in the drift region for straightening field lines therein and reducing gradient curvature crowding of the field lines, e.g., radius or corner curvature. The field shaping regions are in the bulk drift region, removed from the active area of the channel junctions between the alternate conductivity layers in the stack.

DESCRIPTION OF THE DRAWINGS

FIG. 12 is an enlarged isometric illustration showing main and gate terminal structure for FIG. 7.

DETAILED DESCRIPTION

Figure 1:
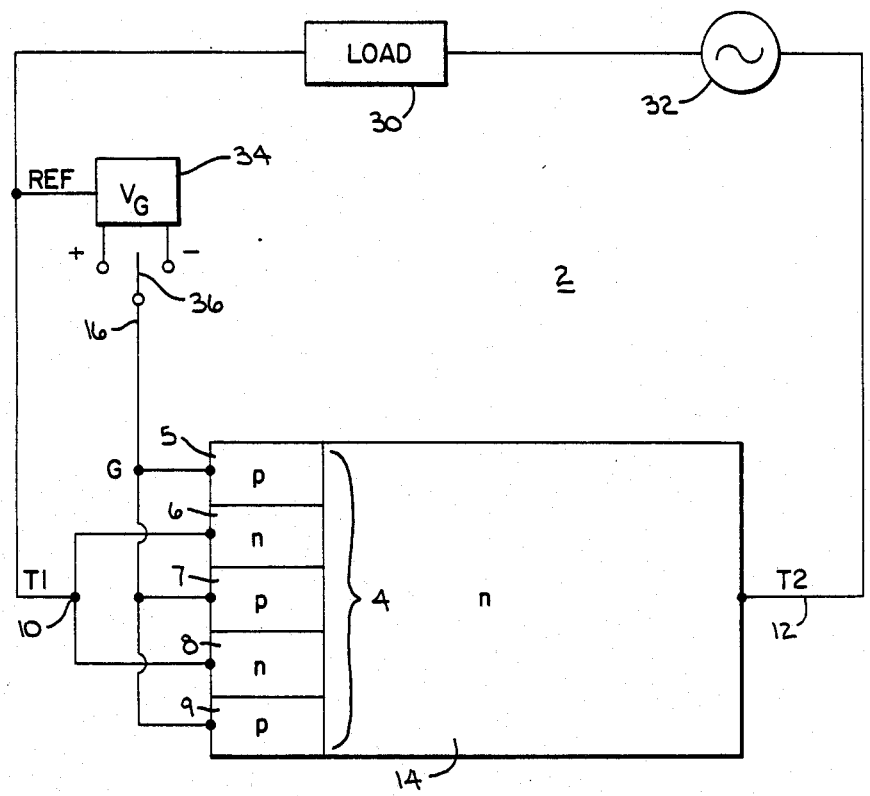
FIG. 1 is a schematic sectional view showing power JFET structure construced in accordance with the invention.

FIG. 1 shows a power JFET 2 having a stack 4 of alternating conductivity type layers such as 5–9 forming a plurality of channels such as 6 and 8. JFET 2 has an ON state conducting bidirectional current through the channels. JFET 2 has an OFF state blocking current flow through the channels due to depletion region pinch-off.

Figure 5:
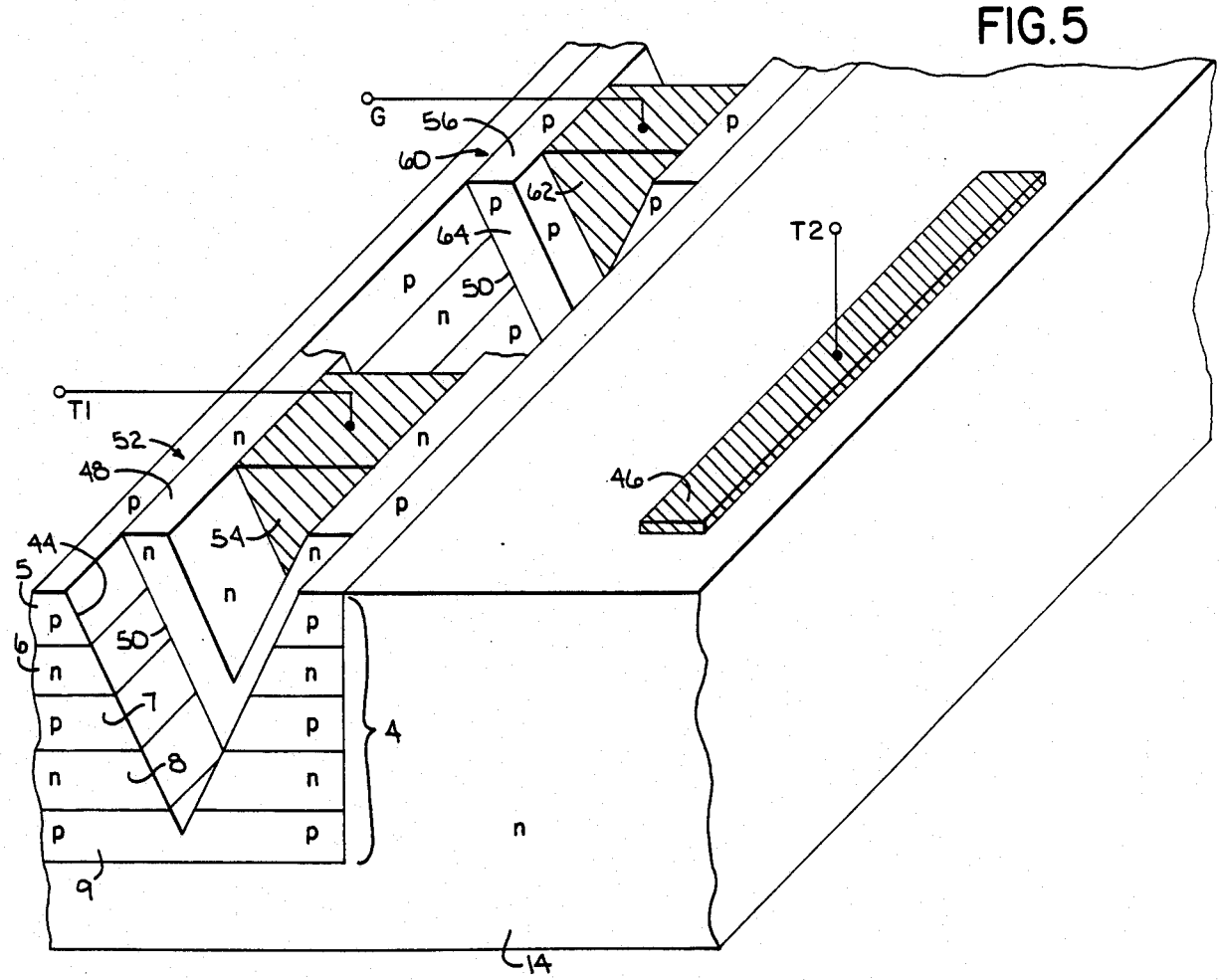
FIG. 5 is an enlarged isometric illustration showing main and gate terminal structure for FIG. 1.
Figure 6:
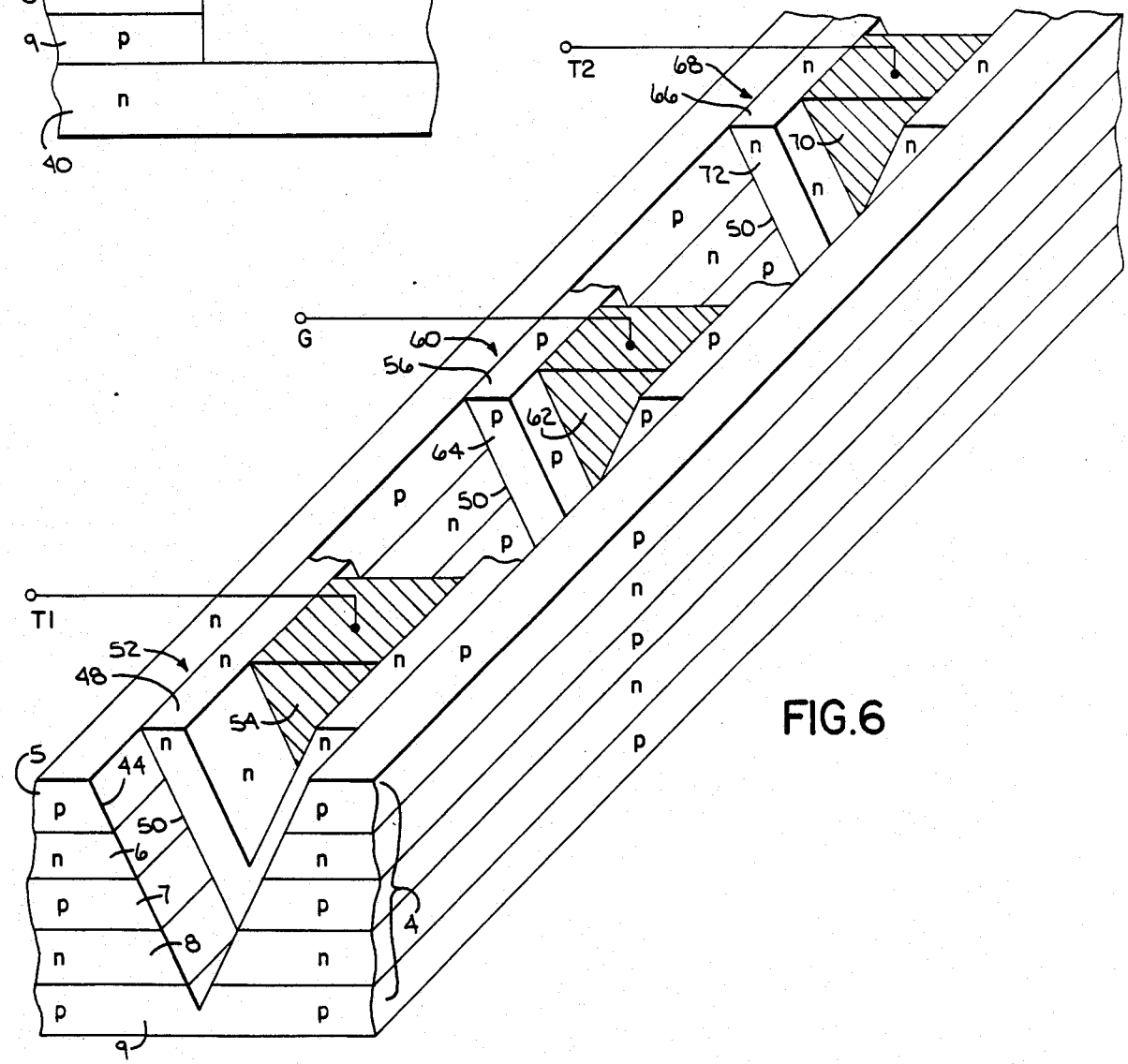
FIG. 6 shows an alternate embodiment of the structure in FIG. 5.

Channels 6 and 8 are of one conductivity type, such as n type. First main terminal means T1, described in greater detail hereinafter in connection with FIGS. 5, 6 and 12, is operatively coupled to one end of the channels, for example the left end as shown at 10 in FIG. 1. Second main terminal means T2, described in greater detail hereinafter in connection with FIGS. 5, 6 and 12, is operatively coupled to the other end of channels 6 and 8 as shown at the right end connection 12 in FIG. 1. In preferred form, a drift region 14 of the one conductivity type is at the right end of stack 4 between the channels and terminal connection 12, such that current flow between terminals T1 and T2 traverses horizontally through channels 6 and 8 and through drift region 14. Gate terminal means G is operatively coupled to the other conductivity type layers such as p layers 5, 7 and 9 in stack 4, as shown at 16.

Figure 2:
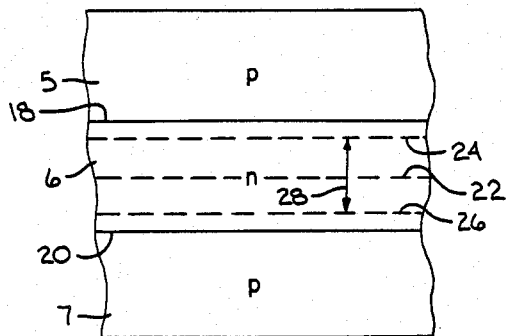
FIG. 2 is an enlarged isolated section of FIG. 1 illustrating a conduction channel, and depletion region pinch-off.

Depletion region spreading from the junctions such as 18 and 20, FIG. 2, between the layers of the stack cause the noted pinch-off OFF state. When the depletion region spreading downwardly from junction 18 meets the depletion region spreading upwardly from junction 20, as shown at dashed line interface 22, channel 6 is pinched-off, and current cannot flow through channel 6 from right to left, or from left to right.

Depletion region shrinking toward the junctions between the layers in the stack enable the noted ON state. For example, in FIG. 2, depletion region shrinking upwardly toward junction 18, as shown at dashed line 24, and depletion region shrinking downwardly toward junction 20, as shown at 26, open a conductive region of width 28 through channel 6. Current may flow leftwardly or rightwardly through channel 6.

FIG. 1 shows power JFET 2 connected in an AC load line, including load 30 and AC power source 32. In the ON state, during the first half cycle of AC source 32, current flows rightwardly through JFET 2, namely from left main terminal T1 through conduction channels 6 and 8, through drift region 14 to right main terminal T2, to complete a circuit through load 30. In other half cycle of AC source 32, current flows leftwardly through JFET 2, namely from right main terminal T2 through drift region 14, through conduction channels 6 and 8 to left main terminal T1.

In the preferred embodiment, JFET 2 is normally OFF. The depletion regions from p layers such as 5 and 7, FIG. 2, normally extend toward and meet each other, as at 22, in the absence of bias on the gate terminal, such that the channels such as 6 are normally pinched-off. JFET 2 is turned ON by biasing gate terminal G to shrink the depletion regions and open conductive channels, such as 28, FIG. 2, such that current can flow between main terminals T1 and T2. Gating voltage source 34 is referenced to main terminal T1 and provides relatively positive gate bias when switch 36 is in its leftward position. Referring to FIG. 2, junctions 18 and 20 are then forward biased, and the depletion regions in layer 6 shrink toward the junctions to open the conductive channel of width 28. In one form of this embodiment, the horizontal length of common drift region 14 is about 60 microns. The vertical width or height of the n type channel layers such as 6 is about 3,000 to 5,000 angstroms. The width or height of the p type layers is arbitrary according to processing. The n type regions have a concentration of about $10^{14}$ or $10^{15}$ atoms per cubic centimeter, and the concentration of the p type regions is about $10^{17}$ or $10^{18}$ atoms per cubic centimeter.

In an alternate embodiment, JFET 2 is normally ON. The depletion reigons from the p type layers, such as 5 and 7 in FIG. 2, normally extend only partially towards each other, as shown at 24 and 26, in the absence of gate bias, to leave open conductive channel 6, as shown at 28, such that current can flow between main terminals T1 and T2. JFET 2 is turned OFF by biasing gate terminal G to spread the depletion regions and pinch-off the channels, as shown at 22, FIG. 2. With switch 36 in its rightward position, a relatively negative gate bias is applied, to thus reverse bias the junctions between the layers in stack 4. For example, reverse biasing of junctions 18 and 20, FIG. 2, spreads the depletion regions to pinch-off the channel, as shown at 22.

As seen in FIG. 1, current flows through the conduction channels and through drift region 14 in a direction perpendicular to the direction of stacking of the layers. Current flows horizontally through the n layer conduction channels and through n drift region 14. Layers 5-9 in stack 4 extend horizontally longitudinally and laterally, and the direction of stacking extends vertically.

Figure 3:
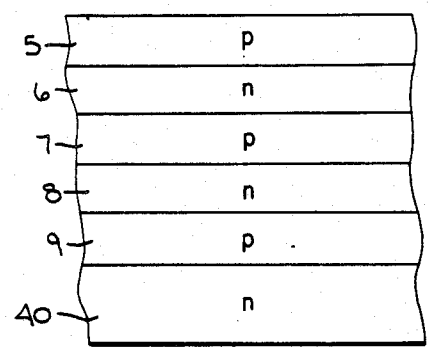
FIGS. 3 and 4 illustrate sequential processing steps for forming the structure of FIG. 1.
Figure 4:
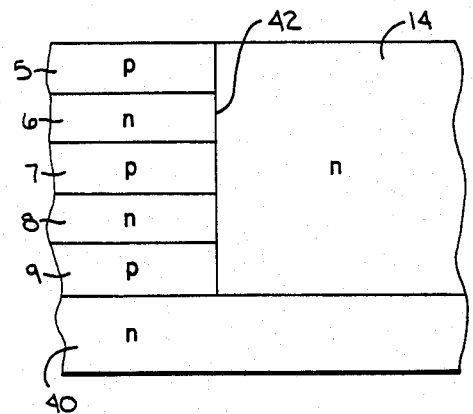

Referring to FIGS. 3 and 4, the formation of JFET 2 is initiated with a substrate such as n type layer 40. Next, alternating conductivity layers such as 5-9 are sequentially epitaxially grown on the top of the substrate. The epitaxial layers are then etched, at 42, FIG. 4, followed by an n type deposition yielding n type drift region 14, yielding the structure shown in FIG. 1 except for the additional n type substrate 40 which is preferred.

First main terminal means T1 at 10, FIG. 1, comprises a first main terminal layer of semiconductor material of the noted one conductivity type, such as n type, extending across and contacting the layers of stack 4, and a first main electrode contacting the first main terminal layer. Gate terminal G at 16 comprises a first gate layer of semiconductor material of the noted other conductivity type, such as p type, extending across and contacting the layers of stack 4, and a gate electrode contacting the gate layer.

Referring to FIG. 5, a groove 44 is notched vertically into stack 4. Groove 44 may be V-shaped or U-shaped, and formed by anisotropic etching, plasma etching, or other suitable means, as known in the art; C. Hu "A Parametric Study of Power MOSFETs", IEEE Electron Device Conference, Paper CH1461-3/79, 0000-0385; IEE Transactions Electron Devices, Volume ED-25, No. 10, Oct. 1978; and Ammar and Rogers, "UMOS Transistors on Silicon", Transactions IEEE, ED-27, pages 907-914, May 1980. Groove 44 extends downwardly into stack 4 and into the bottom-most layer such as 9, and through each layer thereabove. The first main terminal means T1 and the gate terminal means G are in groove 44. Second main terminal means T2 is ohmically connected to drift region 14 as at metallization 46.

The first main terminal means comprises a layer 48 of semiconductor material of the noted one conductivity type, such as n type, extending along the inner surface 50 of groove 44 in a first section 52 thereof to contact the layers 5-9 of stack 4. The first main terminal means also comprises a first main electrode 54 contacting first main terminal layer 48. Electrode 54 is preferably aluminum or polysilicon.

The gate terminal means comprises a gate layer 56 of semiconductor material of the noted other conductivity type, such as p type, extending along the inner surface 50 of groove 44 in a second section 60 thereof to contact the layers 5-9 of stack 4. The gate terminal means also comprises a first gate electrode 62 contacting gate layer 56. Gate electrode 62 is preferably aluminum or polysilicon.

Main electrode 54 and gate electrode 62 are laterally spaced and separated in groove 44 to prevent ohmic contact therebetween. First main terminal layer 48 and gate layer 56 are in contact and are contiguous along an interface such as 64 forming a junction therebetween. Junction 64 has a forward voltage drop thereacross great enough to prevent shorting of the junctions between the layers of stack 4, such as junctions 18 and 20, FIG. 2. This ensures a sufficient voltage differential across the channel junctions such as 18 and 20 to enable depletion region shrinking toward the junctions such as 18 and 20, enabling the noted ON state. The voltage drop across junction 64 and across the channel junctions such as 18 and 20 is typically about 0.7 volts, due to the noted carrier concentrations, which are likewise used for p layer 56 and n layer 48.

In an alternate embodiment shown in FIG. 6, where like reference numerals are used as in FIG. 5 where appropriate to facilitate understanding, the second main terminal means T2 is disposed in the same groove 44 as the first main terminal means T1 and gate terminal means G. Gate terminal means G is between and separates first and second main terminal means T1 and T2, and prevents shorting therebetween. Second main terminal means T2 comprises a layer 66 of the noted one conductivity type, such as n type, extending along the inner surface 50 of groove 44 in a third section 68 thereof to contact the layers 5-9 of stack 4. The second main terminal means T2 in FIG. 6 also comprises a second main electrode 70 contacting second main terminal layer 66. Electrode 70 is preferably aluminum or polysilicon. Second main terminal layer 66 and gate layer 56 are in contact and are contiguous along an interface such as 72 forming a junction therebetween. Junctions 72 and 64 provide respective reverse blocking junctions for each polarity between T1 and T2 to thus prevent shorting therebetween. Junctions 72 and 64 also have forward voltage drops thereacross great enough to prevent shorting of the junctions between the layers of stack 4 so as to ensure a sufficient voltage differential across the junctions of stack 4 to enable the noted depletion region shrinking toward such junctions, such as at 24 and 26, FIG. 2, enabling the noted ON state. In the ON state, current flows horizontally through channels 6 and 8 between T1 and T2.

In the alternate embodiment in FIGS. 7-12, where like reference numerals are used as in FIGS. 1-5 where appropriate to facilitate understanding, field shaping means 80 is provided in drift region 14 and is removed from the active area of the junctions between the layers of stack 4. Field shaping means 80 comprises one or more regions such as 82 of the noted other conductivity type, such as p type, for straightening field lines in drift region 14 and reducing gradient curvature crowding of the field lines, whereby to increase blocking voltage capability. In preferred form, field shaping means 80 comprises one or more floating depletion regions not tied to any source of bias potential. Vertically opposed depletion regions such as 82 and 84 provide the noted field shaping.

Figure 7:
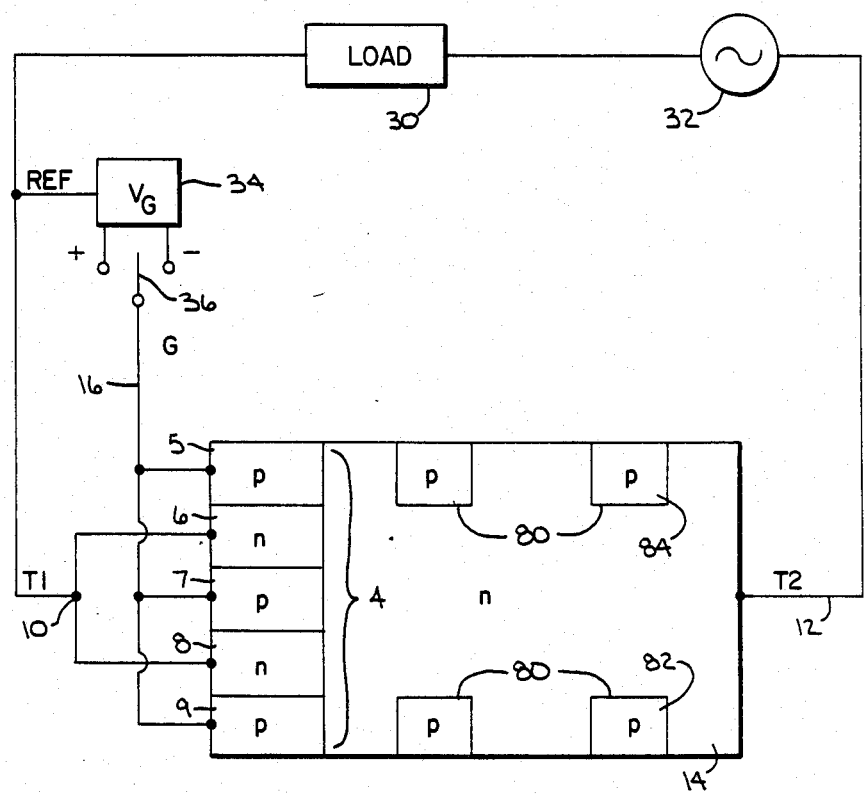
FIG. 7 is a schematic sectional view showing a further alternate embodiment of the invention.
Figure 8:
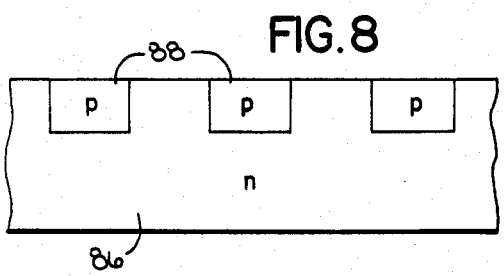
FIGS. 8-11 illustrate sequential processing steps for forming the structure of FIG. 7.
Figure 9:
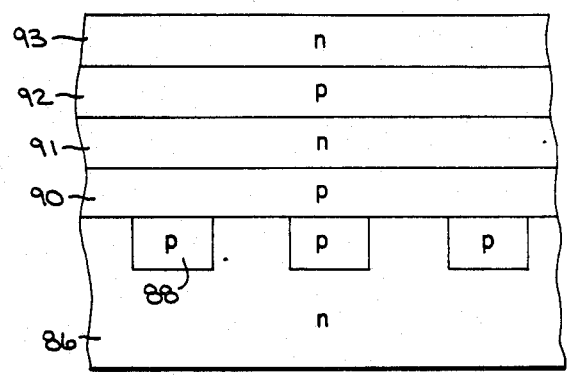
Figure 10:
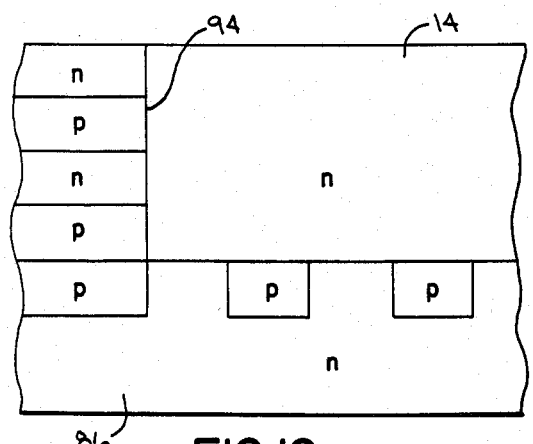
Figure 11:
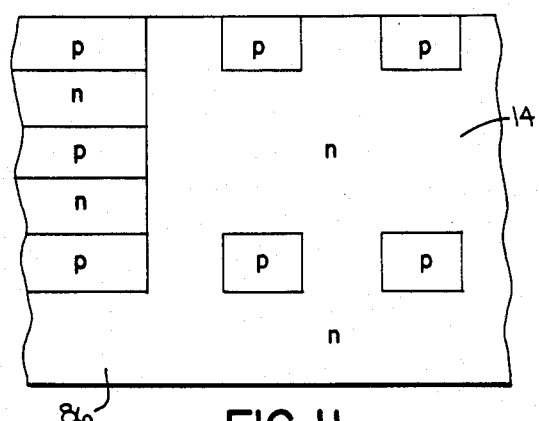

Referring to FIGS. 8-11, the formation of the JFET of FIG. 7 is initiated with a substrate such as n type layer 86. A masked p type diffusion yields p type regions 88, FIG. 8. Next, alternating conductivity layers such as 90-93, FIG. 9, are sequentially epitaxially grown on the top of the substrate. The epitaxial layers are then etched, at 94, FIG. 10, followed by an n type deposition yielding n type region 14 which is the drift region in the finished structure. A masked p type diffusion is then performed, to yield the structure shown in FIG. 11, which is the same as FIG. 7 except for the additional n type substrate 86 which is preferred.

Referring to FIG. 12, a second groove 96 is etched vertically into drift region 14 on the opposite side of field shaping means 80 from stack 4. The second main terminal means T2 is provided by metallization 98 received in groove 96 and substantially horizontally coplanar with first main electrode 54. The lower row of field shaping depletion regions such as 82 in drift region 14 are substantially horizontally coplanar with the bottom layer such as 9 of stack 4. The upper row of field shaping depletion regions such as 84 in drift region 14 are substantially horizontally coplanar with the top layer such as 5 of stack 4. As noted, the upper and lower rows of depletion regions provide straightening of field lines therebetween to reduce gradient curvature crowding and increase blocking voltage capability. Current flows substantially horizontally between main electrodes 54 and 98.

It is recognized that various alternatives are possible within the scope of the appended claims.

We claim:

1. A power JFET comprising:
   a semiconductor substrate of one conductivity type comprising a thin flat wafer lying in a horizontal plane and having top and bottom horizontal major surfaces;
   a plurality of horizontal layers of alternating conductivity type semiconductor material vertically stacked in said substrate, the horizontal layers of said one conductivity type defining a plurality of channels extending left-right and interdigitated with horizontal layers of the other conductivity type and forming a plurality of respective horizontal interface channel junctions therewith;
   first main terminal means operatively coupled to the left end of said channels in said stack;
   a drift region of said one conductivity type in said substrate at the right end of said channels and providing a horizontal left-right conduction path through said drift region;
   second main terminal means operatively coupled to said drift region and spaced rightwardly of said right end of said channels;
   a source of main voltage impressed across said first and second main terminal means;
   gate terminal means operatively coupled to said other conductivity type horizontal layers in said stack;
   gate voltage bias means connected to said gate terminal means and applying a gating bias potential to said other conductivity type horizontal layers, such that for a first polarity of said gate bias means, said channel junctions are forward biased and depletion regions therearound shrink vertically toward said channel junctions to open a conductive horizontal current path through said channels and through said drift region between said first and second main terminal means,
   and such that for a second polarity of said gate bias means, said channel junctions are reverse biased and depletion regions therearound expand vertically away from said channel junctions to close said horizontal current paths and block conduction between said first and second main terminal means;
   a lower row of field shaping depletion regions of said other conductivity type in said drift region substantially horizontally coplanar with the bottom layer of said stack and buried in said substrate and spaced above said bottom horizontal major surface;
   an upper row of field shaping depletion regions of said other conductivity type in said drift region substantially horizontally coplanar with the top layer of said stack and disposed at said top horizontal major surface;
   said upper and lower rows of depletion regions providing straightening of field lines therebetween to reduce gradient curvature crowding and increase voltage blocking capability.

2. The invention according to claim 1 wherein:
   said gate terminal means is connected both to said other conductivity type horizontal layers in said stack and to said one conductivity type horizontal layers in said stack forming said channels;
   said gate bias means is referenced to one of said main terminal means;
   and comprising means preventing electrical shorting of said gate terminal means to said one conductivity type layers in said stack when said channel junctions are forward biased and said gate bias means is at said first polarity.

3. The invention according to claim 2 comprising a forward-rearward groove notched vertically into said stack,
   and wherein:
   said gate terminals means and said first main terminal means are each in the same said groove;
   said first main terminal means comprises a first main electrode and a semiconductor layer of one conductivity type, said first main electrode contacting said last mentioned semiconductor layers, said last mentioned semiconductor layer extending across and contacting said one and said other conductivity type horizontal layers of said stack;
   said gate terminal means comprises a gate electrode and a semiconductor layer of said other conductivity type, said gate electrode contacting said last mentioned semiconductor layer, said last mentioned semiconductor layer extending across and contacting said one and said other conductivity type horizontal layers of said stack;
   said one conductivity type semiconductor layer of said first main terminal means contacts and forms a vertical junction in said groove with said other conductivity type semiconductor layer of said gate terminal means; and
   said first main electrode and said gate electrode are spaced forward-rearward and ohmically separated in said groove.

* * * * *